(12) United States Patent
Takemura

(10) Patent No.: US 6,785,876 B2
(45) Date of Patent: Aug. 31, 2004

(54) DESIGN METHOD FOR SEMICONDUCTOR INTEGRATED CIRCUIT DEVICE

(75) Inventor: Kazuyoshi Takemura, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/985,286

(22) Filed: Nov. 2, 2001

(65) Prior Publication Data

US 2002/0059554 A1 May 16, 2002

(30) Foreign Application Priority Data

Nov. 16, 2000 (JP) ........................................ 2000-349938

(51) Int. Cl.[7] .............................................. G06F 17/50
(52) U.S. Cl. .................................. 716/7; 716/1; 716/3
(58) Field of Search ........................................ 716/1–18

(56) References Cited

U.S. PATENT DOCUMENTS

| | | | |
|---|---|---|---|
| 5,493,507 A | | 2/1996 | Shinde et al. |
| 5,870,588 A | * | 2/1999 | Rompaey et al. ........... 395/500 |
| 6,131,182 A | | 10/2000 | Beakes et al. |
| 6,178,542 B1 | | 1/2001 | Dave |
| 6,195,593 B1 | | 2/2001 | Nguyen |
| 6,199,031 B1 | | 3/2001 | Challier et al. |
| 6,356,862 B2 | * | 3/2002 | Bailey ........................ 703/16 |
| 6,510,541 B1 | * | 1/2003 | Fujiwara et al. ............... 716/5 |

FOREIGN PATENT DOCUMENTS

| | | |
|---|---|---|
| JP | 6-251102 | 9/1994 |
| JP | 8-153129 | 6/1996 |
| JP | P2000-293552 A | 10/2000 |

* cited by examiner

Primary Examiner—Vuthe Siek
(74) Attorney, Agent, or Firm—McDermott, Will & Emery

(57) ABSTRACT

A design method for a semiconductor integrated circuit device enabling flexible selection of IPs while securing the functions of a system is provided. The design method of the present invention includes the steps of: (a) storing a plurality of IPs having the same function in a memory for each of a plurality of functions; (b) constructing a function group structure for satisfying a certain specification; and (c) selecting and retrieving one IP from the plurality of IPs having the same function from the memory for each function in the function group structure and substituting the IP for the function in the function group structure.

7 Claims, 11 Drawing Sheets

|  | MAP1 | MAP2 | MAP3 |
|---|---|---|---|
| Cost-tot | 80 | 100 | 103 |

FIG. 9

```
if(Power(NOW)>MAXpower)
{
    regC=ON;
} else{
    regC=OFF;
    func_C( );
}
```

FIG. 10A
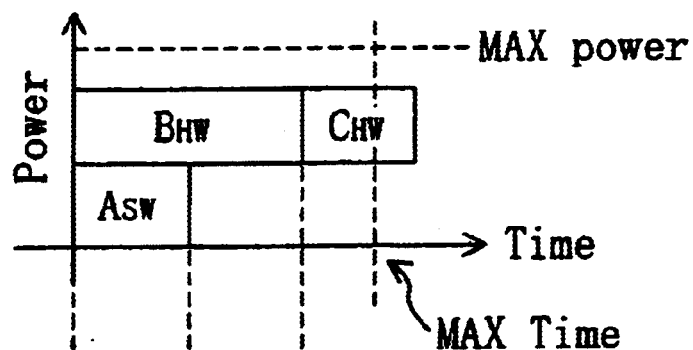
FIG. 10B
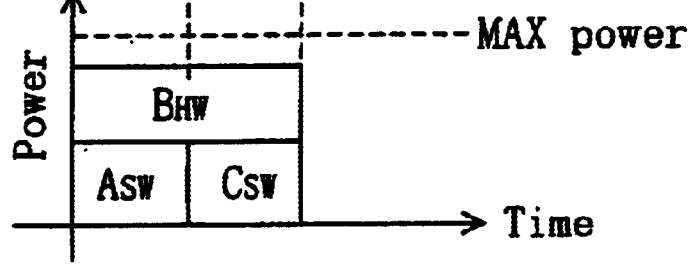
FIG. 11
```
if(Load cpu<IDLE)
{
    regC=OFF;
    func_C( );
} else{
    regC=ON;
}
```

FIG. 13
Memory map
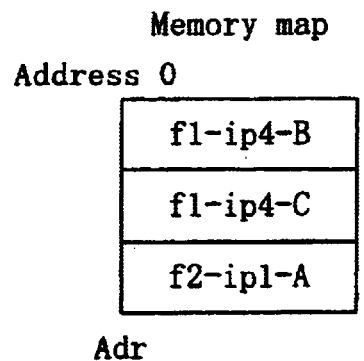
FIG. 14
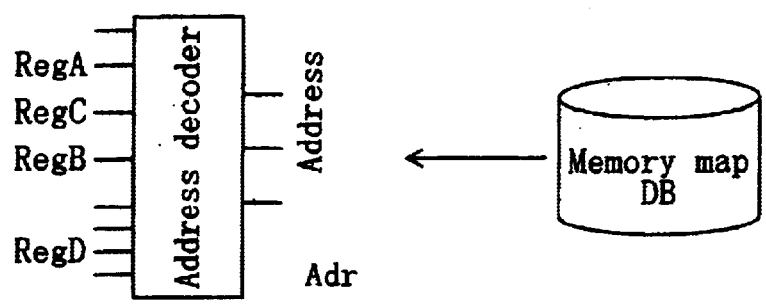
FIG. 15
Driver function template
   read_mem8( );write_mem8( )
   read_mem16( );write_mem16( )

DESIGN METHOD FOR SEMICONDUCTOR INTEGRATED CIRCUIT DEVICE

BACKGROUND OF THE INVENTION

The present invention relates to a design method for a semiconductor integrated circuit device including a plurality of circuits having a plurality of functions.

In recent years, a concept of system LSI constructed of a plurality of LSI circuits formed on a common substrate has been raised, and various design techniques for system LSI have been suggested. An advantage of the system LSI is that memories such as DRAMs, logic LSI circuits, and analog circuits such as high-frequency circuits can be incorporated in one semiconductor device, to attain semiconductor devices of various types and functions in exceedingly high integration.

In design of the conventional system LSI described above, design properties called cores or intellectual properties (IPs) are often used. Such cores are independently designed. Therefore, when the cores are united into a device, smooth operation may not necessarily be secured. In order to design a system that can secure smooth operation, however, enormous amounts of time and effort are actually required since the respective cores or IPs are black boxes.

SUMMARY OF THE INVENTION

An object of the present invention is providing a design method for a semiconductor integrated circuit device in which optimization is facilitated by providing a means of permitting flexible selection of IPs while the consistency of the function of the IPs is maintained.

The first design method for a semiconductor integrated circuit device of the present invention includes the steps of: (a) storing a plurality of IPs common in function in a memory for each of a plurality of functions; (b) constructing a function group structure for satisfying a certain specification; and (c) selecting and retrieving one IP from the plurality of IPs common in function from the memory for each function in the function group structure and substituting the IP for the function in the function group structure.

By the above method, it is possible to store a plurality of IPs common in function in a library and select an appropriate IP for each function. This ensures the consistency of the function irrespective of a change of the IP, and thus the time required for design, which is conventionally long, can be reduced to a minimum.

The above design method may further include the step of: (e) for each function, dividing an object implementing the function so that the object is mapped to a hardware (HW) model and a software (SW) model of architecture models in a database. This enables design of an optimized semiconductor integrated circuit device.

The above design method may further include the step of: (d) expanding the IP hierarchically into functional blocks after the step (c), wherein in the step (e), for each of the functional blocks obtained by the expansion, an object implementing the functional block is mapped to a HW model and a SW model of architecture models. This enables design of a further optimized semiconductor integrated circuit device.

The second design method for a semiconductor integrated circuit device of the present invention includes the steps of: (a) storing a plurality of IPs each having a function in a memory; (b) constructing a function group structure for satisfying a certain specification; (c) selecting and retrieving an IP having a function from the memory for each function in the function group structure and substituting the IP for the function in the function group structure; (d) expanding the IP hierarchically into functional blocks; and (e) for each of the functional blocks obtained by the hierarchical expansion, dividing an object implementing the functional block so that the object is mapped to a HW model and a SW model of architecture models in a database.

By dividing the IP into a HW model and a SW model after the IP is hierarchically expanded as described above, mapping can be performed separately for the HW model and the SW model for the IP. This enables design of a more optimized system compared with the mapping for the IP as a unit.

In the step (e), static analysis considering overlap of an area may be performed for HW portions of the functional blocks. This improves the precision of estimation of the area.

The above design method may further include the step of: (f) performing dynamic performance analysis for determining the mapping of each functional block in the function group structure to a HW model and a SW model after the step (e). This improves the precision of the analysis.

The database preferably stores a SW model having a function equivalent to HW for each function of the HW.

In the step (f), the mapping of each functional block to a HW model and a SW model may be switched so that the power consumption is kept from exceeding an upper limit along the time axis.

In the step (f), also, when the load rate of CPU obtained when a functional block is mapped to HW is below a certain lower limit, the mapping of the functional block may be switched to SW.

In the step (e), analysis considering power consumption of a memory may be performed.

The third design method for a semiconductor integrated circuit device of the present invention includes the steps of: (a) storing a plurality of HW models in a memory as architecture models; and (b) retrieving architecture models from the memory as a model group to construct an architecture satisfying a certain specification from the model group, wherein in the step (b), the architecture is constructed so that the model group includes a plurality of buses and a bus bridge model for connecting the buses.

By providing a plurality of buses as described above, it is possible to construct an architecture suitable for a structure having a semiconductor interconnection substrate, such as an IPOS device.

In the step (b), the bus bridge model may connect two buses having different widths in a manner of adjusting the bus widths and the data transfer speeds. This enables smooth data transfer in the case where the bus widths and the data transfer speeds of two buses connected to the bus bridge model are different from each other, for example.

The fourth design method for a semiconductor integrated circuit device of the present invention includes the steps of: (a) storing a plurality of HW models in a memory as architecture models; (b) retrieving architecture models from the memory as a model group to construct an architecture satisfying a certain specification from the model group, (c) constructing a function group structure for satisfying the certain specification; (d) providing test benches on input and output sides of the function group structure; and (e) mapping functions in the function group structure and the test benches to the models in the architecture.

By the above method, a test bench can be mapped to HW. This enables use of parameters such as the time required for input/output at the test bench in the performance analysis and the like.

In the step (a), the plurality of models may include an interface (I/F) model, and in the step (b), the architecture may be constructed so as to include an I/F model in the model group. This enables optimization of a system in consideration of signal delay and power consumption at the I/F model handling input/output signals.

In the step (e), the test bench on the input or output side may be mapped to the I/F model in the architecture. Thus, the test bench, which is conventionally handled as a mere input signal, is mapped to an I/F model as HW. This enables analysis of the processing time considering delay and analysis of power consumption considering operation of the I/F model, in the subsequent performance analysis. In other words, analysis precision can be improved.

In the step (a), the plurality of models may include a memory. In the step (b), the architecture may be constructed so as to include a memory in the model group, and in the step (e), the test bench on the input or output side may be mapped to the memory in the architecture.

The fifth design method for a semiconductor integrated circuit device of the present invention includes the steps of: (a) storing a plurality of IPs each having a function in a memory; (b) constructing a function group structure for satisfying a certain specification; (c) selecting and retrieving an IP having a function from the memory for each function in the function group structure and substituting the IP for the function in the function group structure; (d) expanding the IP hierarchically to a functional block level; (e) mapping each functional block obtained by the hierarchical expansion to a model in an architecture model; and (f) preparing an inter-block table describing a path from the functional block to another functional block receiving an output from the functional block as an inter-model path in the architecture model.

By preparing an inter-block path table as described above, dynamic performance analysis can be performed with good precision.

The sixth design method for a semiconductor integrated circuit device of the present invention includes the steps of: (a) storing a plurality of IPs each having a function in a memory; (b) constructing a function group structure for satisfying a certain specification; (c) selecting and retrieving an IP having a function from the memory for each function in the function group structure and substituting the IP for the function in the function group structure; (e) mapping each function in the function group to a model in an architecture model in a database; (f) setting precedence of the model for access to a bus; and (g) performing static performance analysis for the function group structure in the state where the respective functions in the function group structure have been mapped to the models, wherein in the static performance analysis, the power consumption of the function group structure is calculated using the precedence of each model for access to a bus in the architecture model in place of the number of toggles.

By using the precedence in place of the number of toggles, power consumption can be determined with a measure of accuracy even in static analysis in which the number of toggles is not available.

BRIEF DESCRIPTION OF THE DRAWINGS

FIG. 9 is an example of a program for HW/SW switching control considering power consumption, described in the C language.

FIGS. 10A and 10B are views showing dependency of processing speed on power consumption during dynamic HW/SW switching.

FIG. 11 is an example of a program for HW/SW switching control considering processing speed, description in the C language.

FIG. 13 is a view showing a memory map obtained by preparing SW by compiling a program.

FIG. 14 is a view illustrating processing of retrieving an association table between HW registers and addresses from a memory map DB to prepare an address decoder.

FIG. 15 is an example of a driver function template for access to basic hardware.

DESCRIPTION OF THE PREFERRED EMBODIMENTS

Basic Structure of IPOS Device

As one means for attaining a semiconductor device incorporating devices of various types and functions while securing a large cross-section of interconnections, there exists a construction where chip IPs incorporating various types of devices are mounted on a semiconductor interconnection substrate including an interconnection layer, such as a silicon interconnection substrate (super-sub). In this construction, circuits (ICs) provided in the respective chip IPs can be handled as IPs (intellectual properties) in design of a semiconductor device, and the resultant semiconductor device can be considered as that obtained by bonding the IPs of various types to the semiconductor interconnection substrate. That is, the entire semiconductor device constitutes "IPs on super-sub", and therefore, the entire semiconductor device including a silicon interconnection substrate and IPs is herein called an "IPOS device".

Figure 1A:
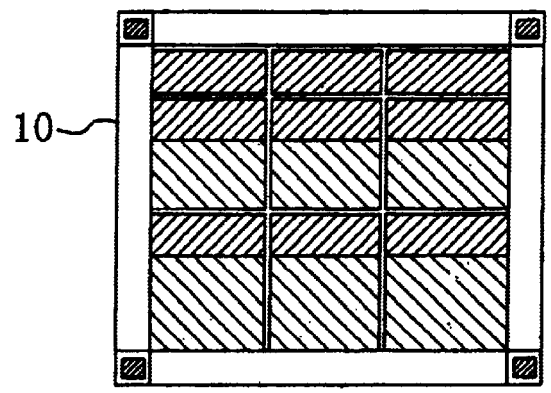
FIGS. 1A, 1B, and 1C are a plan view of a silicon interconnection substrate on which IPs are to be mounted, plan views of examples of IPs to be mounted on the silicon interconnection substrate, and a cross-sectional view of the silicon interconnection substrate, respectively.
Figure 1B:
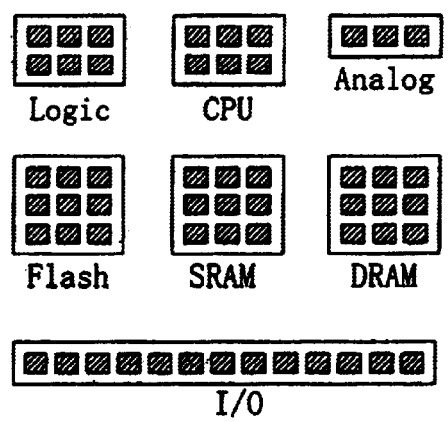
Figure 1C:
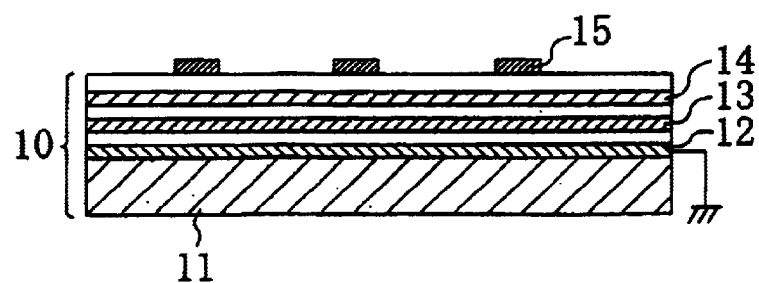

FIGS. 1A, 1B, and 1C are a plan view of a silicon interconnection substrate on which IPs (chip IPs) are to be mounted, plan views of examples of IPs to be mounted on the silicon interconnection substrate, and a cross-sectional view of the silicon interconnection substrate, respectively.

As shown in FIGS. 1A and 1B, the top surface of a silicon interconnection substrate 10 has a plurality of regions for mounting various IPs. The regions are prepared to receive various IPs, such as an analog IP, a logic IP, a CPU IP, a flash memory IP, a SRAM IP, a DRAM IP, and an I/O IP, in the form of chip IPs. As shown in FIG. 1C, the silicon interconnection substrate 10 includes: a silicon substrate 11; a ground plane 12 formed on the silicon substrate 11 via an insulating film (not shown); a first interconnection layer 13 formed on the ground plane 12 via an interlayer insulating film; a second interconnection layer 14 formed on the first interconnection layer 13 via an interlayer insulating film; and pads 15 formed on the second interconnection layer 14 via a passivation film. The pads 15, the interconnection layers 13 and 14, and the ground plane 12 are connected with each other via respective contacts (not shown) at desired positions. The IPs are bonded to the pads 15 to allow the IPs to be in electrical connection with each other or with the ground plane 12 via the interconnection layers 13 and 14.

Limitation on the sizes of the interconnection layers 13 and 14 of the silicon interconnection substrate 10 is not rigid. Even interconnections having a width of several micrometers are allowed. This enables the following effects. That is, it is empirically possible to provide interconnections having a size adopted in semiconductor integrated circuit devices of a generation in which the characteristics of interconnections were best in the past progress of downsizing of the semiconductor integrated circuit devices. In addition, it is possible to reduce the electrical impedance at the interconnections.

The chip IPs on the silicon interconnection substrate have many functions. In this aspect, two ways of thinking are available: one is to use functions as many as possible, and the other is to limit the function used. To state more specifically, on the one hand, it is preferable to provide a construction adaptable to various uses to respond to a variety of demands of the user. On the other hand, it is required to limit the use to one of the functions during actual use. By satisfying these two conflicting requirements, it is possible to construct an IPOS device that responds to a variety of demands of the user and yet suits to mass production of reduced varieties.

In view of the above, it is important to incorporate various functions in respective IPs (chip IPs) after dividing the functions into hardware (HW) and software (SW), under the conditions that the subsequent processing of selection, limitation, switching, setting, and the like can be flexibly performed, that is, the flexibility of the processing for the functions is maintained.

In the following embodiment, discussed is HW/SW co-design suitable for a large-scale system such as an IPOS device (hereinafter, referred to as an "IPOS system"). It should however be noted that the present invention is also applicable to design of conventional large-scale integrated circuit systems such as the so-called system LSI, not restricted to the IPOS system.

(Embodiment)
Overall Outline of HW/SW Co-design

Figure 2:
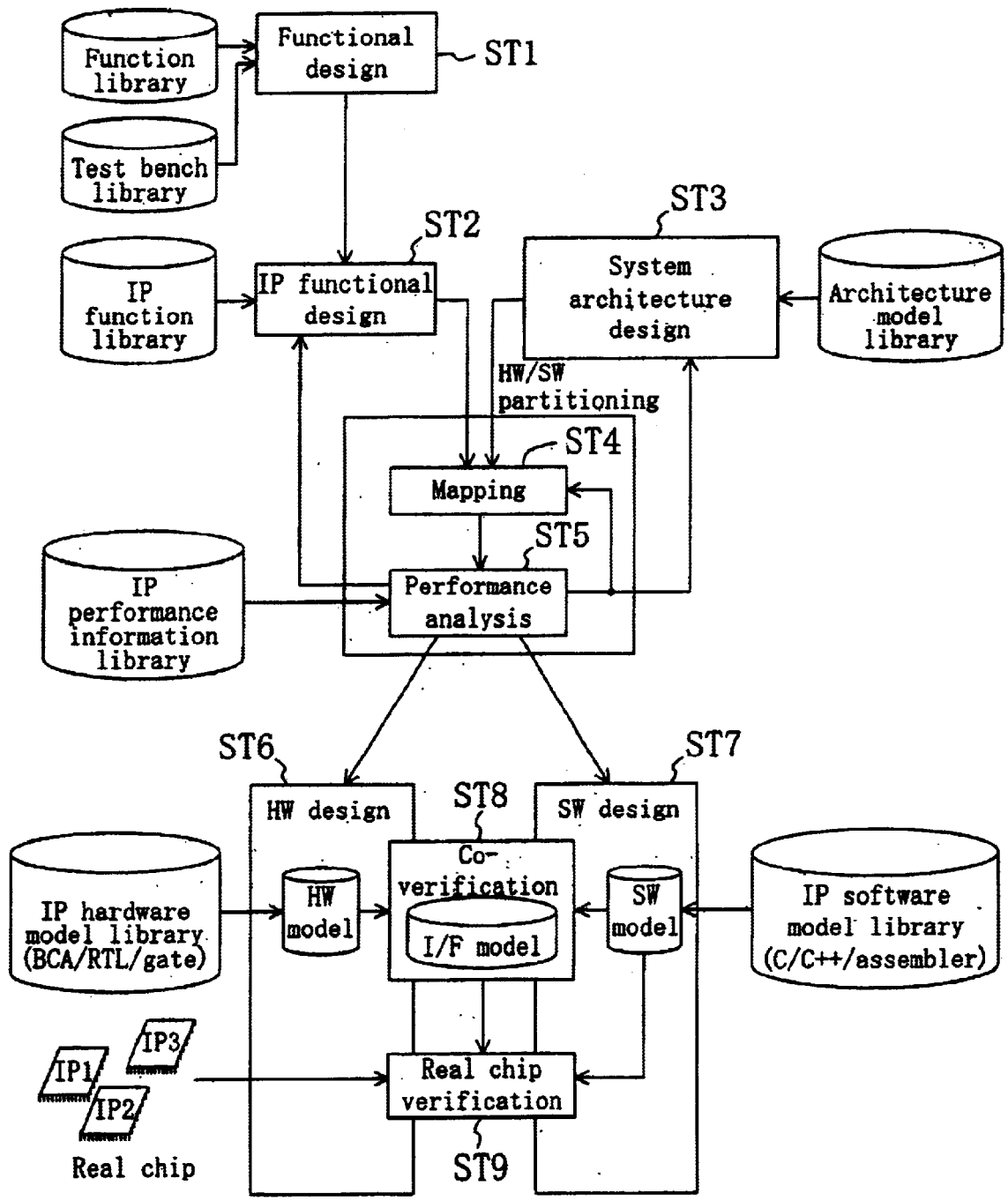
FIG. 2 is a flow diagram showing a schematic procedure of HW/SW co-design in an embodiment of the present invention.

FIG. 2 is a flow diagram showing a schematic procedure of HW/SW co-design in the embodiment of the present invention.

In step ST1, functional design is performed using a function library and a test bench library. In step ST2, IP functional design is performed using an IP function library. In steps ST1 and ST2, functions necessary for respective IPs that are to be mounted on a semiconductor device are described in the C language, for example. This is the stage at which only signal processing (algorithm) has been described in the case of JPEG, for example.

In step ST3, system architecture design is performed using an architecture model library. The system architecture model library includes architecture models as HW and SW models required for design of the system. In step ST3, therefore, the models are connected to buses to construct an outlined structure of the entire system.

In step ST4, mapping is performed. That is, respective functions (functional blocks) are mapped to models of the architecture. In step ST5, performance analysis is performed using a performance library. If a problem is found as a result of the analysis, the procedure returns to the architecture design in step ST3 or the mapping in step ST4, to enter the loop of repeating the steps until satisfactory performance is obtained.

In steps ST6 and ST7, HW design and SW design are performed separately using an IP hardware model library and an IP software model library, for example, respectively. Once both HW and SW are designed in detail, HW/SW co-verification is performed using an I/F model in step ST8. In step ST9, real chip verification is performed using real chips for confirmation of functions of the real chips.

Functional Design and IP Functional Design

Figure 3:
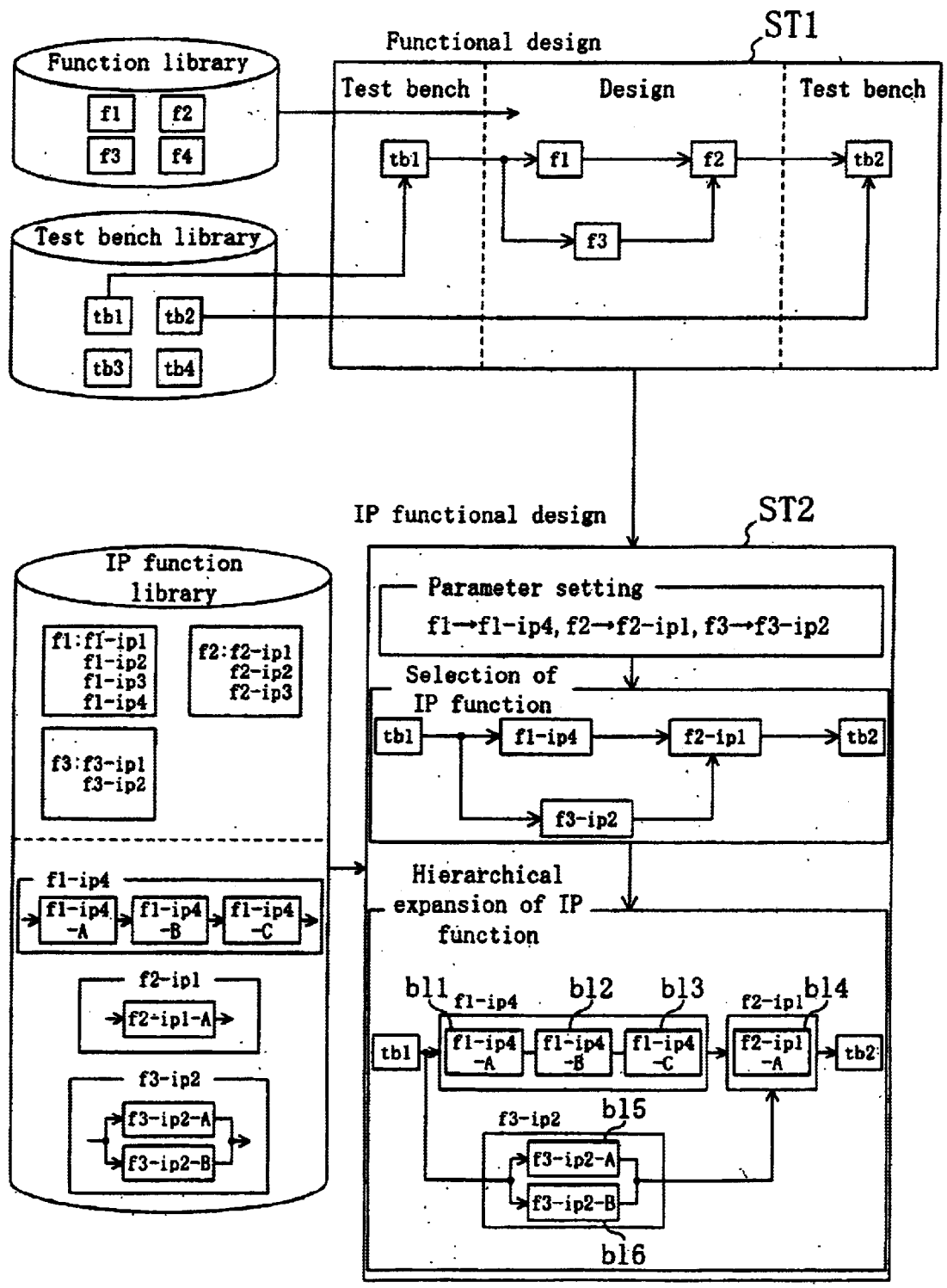
FIG. 3 is a partial flow diagram illustrating details of the processing in functional design and IP functional design.

FIG. 3 is a partial flow diagram illustrating details of the processing in step ST1 for functional design and in step ST2 for IP functional design.

The functional design in step ST1 is performed in the following procedure. The function library stores various functions such as f1, f2, f3, and f4, which represent functions such as MPEG and JPEG in image processing, for example. The test bench library stores various test benches such as tb1, tb2, tb3, and tb4, which represent data provided for determining whether or not the functional design is proper. For example, when a design combining the functions f1, f2, and f3 exists as shown in step ST1 in FIG. 3, tb1 is retrieved from the test bench library as the input test bench and supplied as input data. As output data, an image output test bench tb2, for example, is provided. In this way, whether or not the design prepared in this step is proper can be verified to some extent.

The IP functional design in step ST2 is performed in the following procedure. The IP function library stores some IPs for each of the functions f1, f2, f3, and f4 for implementing the functions. For example, IPs f1-ip1 to f1-ip4 are stored for the function f1, IPs f2-ip1 to f2-ip3 are stored for the function f2, and IPs f3-ip1 and f3-ip2 are stored for the function f3. Among these IPs, an IP to be used for each of the functions f1, f2, and f3 in the design is designated by rough estimation. For example, parameter designation is made so that f1-ip4 is used for the function f1, f2-ip1 for the function f2, and f3-ip2 for the function f3.

Thereafter, f1-ip4, f2-ip1, and f3-ip2 are mapped to the functions f1, f2, and f3 in the design prepared in step ST1. That is, selection of IP functions is performed. At this stage, the respective selected IPs have the functions f1, f2, and f3 described in step ST1. Therefore, the verification results are the same as those obtained in step ST1.

As described above, a plurality of IPs common in function are stored in the library, and an appropriate IP is selected among these IPs for each function. Therefore, the consistency of the function can be maintained even when the IP is changed, and thus the time required for design, which is conventionally long, can be reduced to a minimum.

Subsequently, the IP function is subjected to hierarchical expansion in which the IP function is divided further in detail into individual functions. For example, suppose it is found from hierarchical expansion that fi-ip4 has a function of performing first fi-ip4-A (for example, cosine transform), then f1-ip4-B (for example, quantization), and finally fi-ip4-C (for example, Haffman coding). In this case, the IP f1-ip4 is expanded into functional blocks fi-ip4-A, fi-ip4-B, and fi-ip4-C. Likewise, suppose f2-ip1 is hierarchically expanded into a functional block f2-ip1-A, and f3-ip2 is hierarchically expanded into functional blocks f3-ip2-A and f3-ip2-B. The functions f1, f2, and f3 in the design are then replaced with the functional blocks obtained by the hierarchical expansion. These hierarchically expanded IPs are to be subjected to HW/SW division that is a feature of the present invention.

Architecture Design

Figure 4:
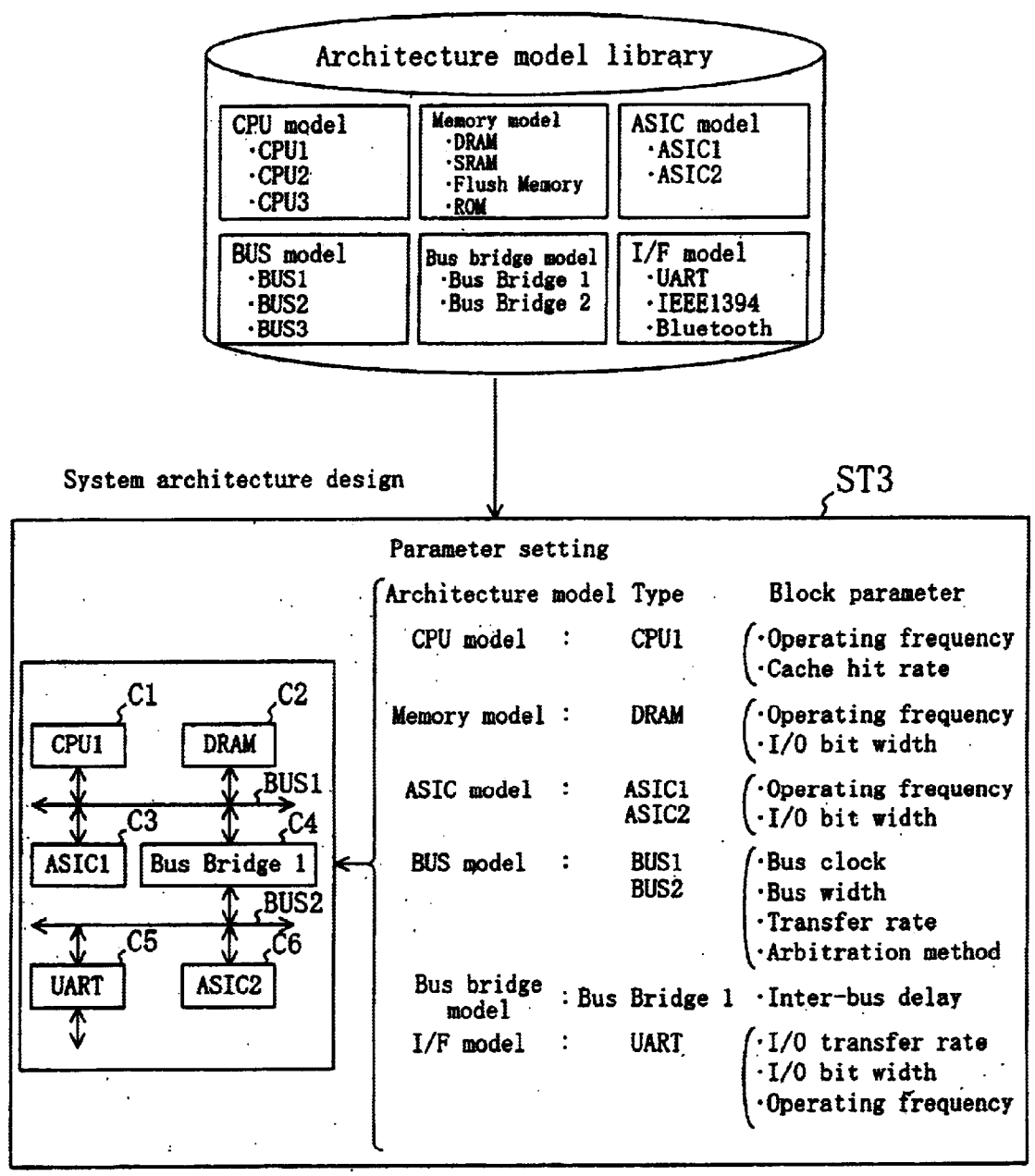
FIG. 4 is a partial flow diagram illustrating details of the processing in system architecture design.

FIG. 4 is a partial flow diagram illustrating the details of processing in step ST3. As shown in FIG. 4, the architecture model library stores many types of models for models (c) such as CPU models, memory models, ASIC (logic circuit) models, bus models, bus bridge models, and I/F models. Each model has various model parameters to which values are given. For example, the CPU models have parameters of the operating frequency and the cache hit rate. The DRAM models have parameters of the operating frequency and the bit width. The ASIC models have parameters of the operating frequency and the bit width. The bus models have parameters including the bus clock, the bus width, the transfer rate (bps), and the arbitration method. The bus bridge models have a parameter of the delay between bus bridges. The I/F models have parameters of the I/O transfer rate (bps), the I/O bit width, the operating frequency, and the bit width when UAET is selected. Specific values are given to the respective model parameters. After the parameters are specified, constructed is an architecture having a structure shown in FIG. 4, for example, in which CPU1 (c1), DRAM1 (c2), ASIC1 (c3), ASIC2 (c6), and UART (c5) are connected via BUS1 and BUS2 and Bus Bridge 1 (c4).

A feature of the above architecture is that a plurality of buses (BUS1 and BUS2) are provided and Bus Bridge 1 (c4) for connecting BUS1 and BUS2 is set as a model. Two or more buses may be provided. Such an architecture having a plurality of buses is suitable for a structure having a semiconductor interconnection substrate, such as a semiconductor device.

A plurality of buses may be provided by forming a low-speed bus or a high-speed bus in addition to a normal bus. Having a bus bridge model enables smooth data transfer in the case where the bit widths of two buses connected to the bus bridge model are different from each other, for example. An example of the bus bridge model is a buffer that supplies data from a 16-bit wide bus (BUS1, for example) to another bus (BUS2, for example) every 8 bits. In this architecture, also, the I/F model is provided separately from the ASIC. This enables the system to be optimized in consideration of signal delay and power consumption at the I/F model that handles input/output signals.

Mapping

Figure 5:
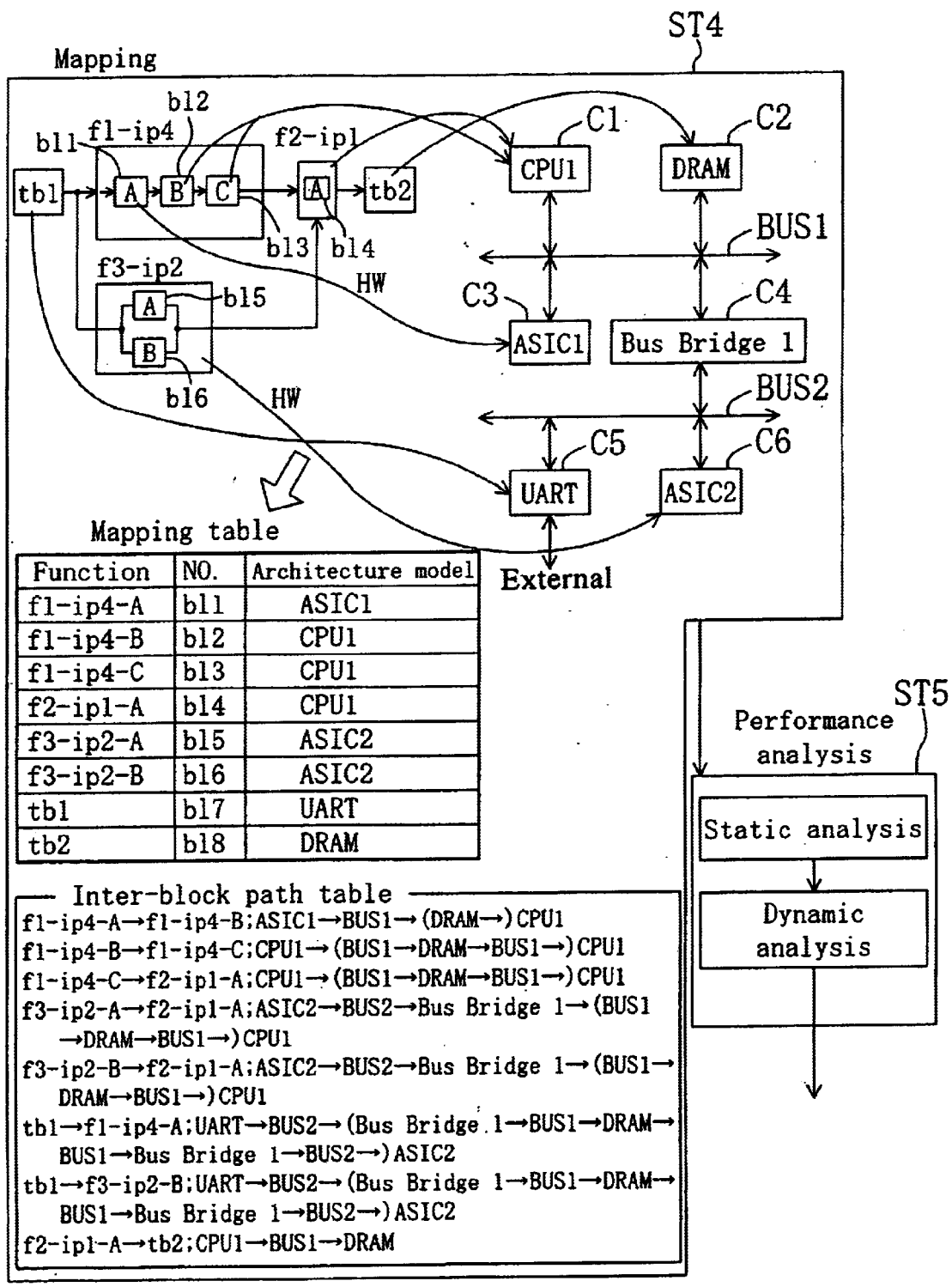
FIG. 5 is a partial flow diagram illustrating mapping and outlined performance analysis.

FIG. 5 is a partial flow diagram illustrating mapping and outlined performance analysis in steps ST4 and ST5.

As shown in FIG. 5, in step ST4, mapping is performed. That is, the hierarchically expanded IPs in the design obtained in the IP functional design in step ST2 are mapped to HW and SW models. For example, the test bench tb1 is mapped to UART that is an I/F model, as HW. The test bench tb2 is mapped to DRAM as HW. The functional block f1-ip4-A (b11) in the hierarchically expanded IP f1-ip4 is mapped to ASIC1 as HW, the functional blocks f1-ip4-B (b12) and f1-ip4-C (b13) are mapped to CPU1 as SW. The functional block f2-ip1-A (b14) in the IP f2-ip1 is mapped to CPU1 as SW, and the functional blocks f3-ip2-A (b15) and f3-ip2-B (b16) in the IP f3-ip2 are mapped to ASIC2 as HW.

The feature of the above mapping is that the test bench tb1 is mapped to an I/F model. By mapping the test bench, which is conventionally handled as a mere input signal, to an I/F model as HW, the following can be realized. In the subsequent performance analysis, analysis of the processing time considering delay is possible. Also, analysis of the power consumption considering operation of the I/F model is possible. In other words, the analysis precision can be improved.

As described above, one IP can be mapped to HW and SW appropriately. This is attained because each IP has been hierarchically expanded to the level of functional blocks as described above. During the mapping, a mapping table showing the association between the functions and the models in the design is prepared together with functional block numbers (b11 to b18) as shown in the lower part of FIG. 5. Also prepared is an inter-block path table, which indicates that the path of functional block f1-ip4-A→functional block f1-ip4-B is represented by a path of data of ASIC1→BUS1→(DRAM →) CPU1, and the path of functional block f1-ip4-B→functional block f1-ip4-C is represented by a path of data of CPU1→(DRAM→) CPU1, for example. This table is stored in a memory (not shown) of a design apparatus. The model in the parentheses above indicates that the path may or may not pass the model.

By preparing the inter-block path table as described above, dynamic performance analysis to follow can be performed with improved precision.

Thereafter, in step ST5, performance analysis is performed using the results of the mapping described above. In this step, both of static analysis and dynamic analysis may be performed, or only either one of them may be performed.

Performance Analysis (Static Analysis)

Figures 6, 7:
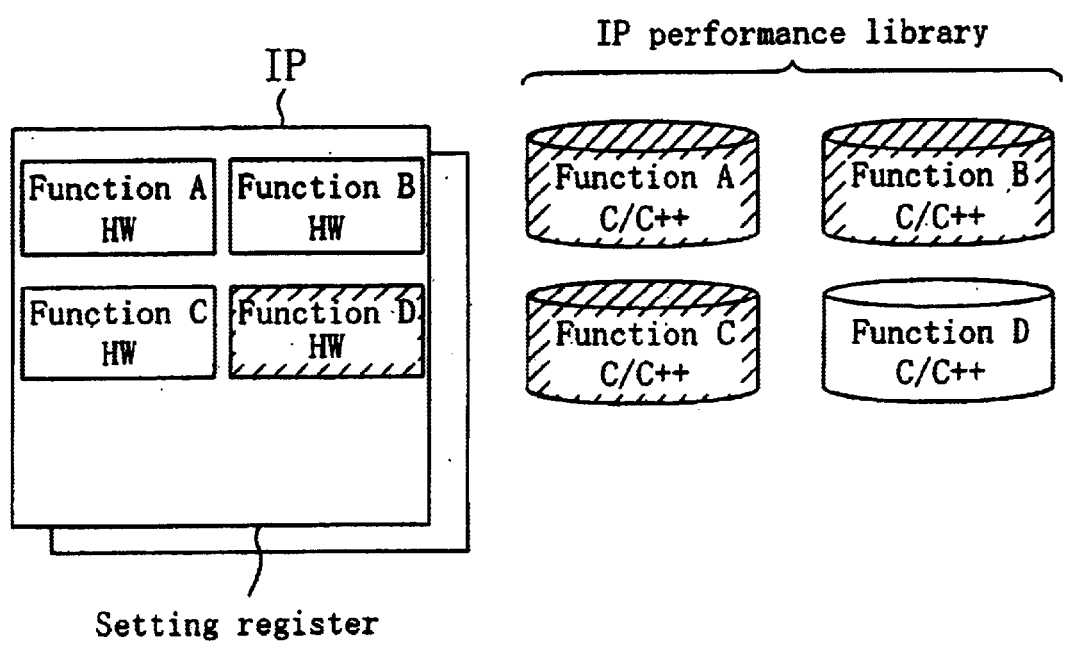
FIG. 6 shows examples of values of cost function (Cost-tot) as results of different types of mapping.
FIG. 7 is an illustration for explaining static HW/SW division.

In static performance analysis, the cost function (Cost-tot) of the entire system is determined by defining the cost function (Cost-tot) using a desired parameter as a variable, for example. And, the design is performed with a target of minimizing the cost function (Cost-tot) or suppressing it below a certain upper limit. An example of the cost function (Cost-tot) is represented by expression (1) below.

$$\text{Cost-}tot = k1(\text{Speed}_{HW\text{-}tot} + \text{Speed}_{SW\text{-}tot})$$

$$K2(\text{Area}_{HW\text{-}tot} + \text{Area}_{SW\text{-}tot})$$

$$K3(\text{Power}_{HW\text{-}tot} + \text{Power}_{SW\text{-}tot}) \quad (1)$$

where K1, k2, and k3 are the weight coefficients, $\text{Speed}_{HW\text{-}tot}$ and $\text{Speed}_{SW\text{-}tot}$ are the processing speeds of the entire HW and the entire SW, respectively, $\text{Area}_{HW\text{-}tot}$ and $\text{Area}_{SW\text{-}tot}$ are the areas of the entire HW and the entire SW, respectively, and $\text{Power}_{HW\text{-}tot}$ and $\text{Power}_{SW\text{-}tot}$ are the powers consumed by the entire HW and the entire SW, respectively. That is, in this example, it is intended to construct a system so that the processing speed as a parameter is as high as possible, the area as a parameter is as small as possible, and the power consumption as a parameter is as small as possible. Therefore, it is determined that the cost function (Cost-tot) is more suitable as it is smaller. Note that hereinafter the processing speed is represented as the processing time. For example, assuming that values of cost function (Cost-tot) shown in FIG. 6 are obtained as a result of mappings MAP1, MAP2, and MAP3, the mapping MAP1 providing the smallest value is considered most suitable.

To state concretely, the processing speed is calculated as represented by expression (2) below, for example, using the mapping results.

$$\text{Speed}_{HW\text{-}tot}(f_{b11} \text{ to } f_{b16}, f_{bus}, R_{bus}, P_{b11} \text{ to } P_{b16})$$
$$= \text{Speed}_{HW\text{-}b11}(f_{c3}, f_{bus}, R_{bus}, P_{c3}) + \ldots + \text{Speed}_{HW\text{-}b16}(f_{c6}, f_{bus}, R_{bus}, P_{c6}) \quad (2)$$

where b11 to b16 are the functional block numbers obtained when the IPs are mapped as shown in FIG. 5, c1 to c6 are the model numbers, f is an operating frequency, R is the transfer rate of a bus, and P is the precedence (value between 0 and 1) of the function to a bus. The precedence P is set so that the sum of the precedence values of all the models connected to the bus is 1.

The processing speed of the functional block b11 (f1-ip4-A), for example, in expression (2) can be calculated by expression (3) below.

$$\text{Speed}_{HW\text{-}b11}(f_{c3}, f_{bus}, R_{bus}, P_{c3}) = 1/(f_{c3} \times f_{bus} \times R_{bus} \times P_{c3}) \quad (3)$$

That is, since the processing speed is preferably as small as possible, the processing speed (Speed) as a model of the cost function (Cost-tot) is calculated from the reciprocal of the operating frequency f, the transfer rate R, and the precedence P.

The processing speed model $\text{Speed}_{SW\text{-}tot}$ for SW in expression (1) is calculated as represented by expression (4) below based on the inter-block path table for the mapping.

$$\text{Speed}_{SW\text{-}tot}(\text{St}_{CPU\text{-}c1} \text{ to } \text{St}_{CPU\text{-}c6}, f_{CPU}) = \text{Speed}_{SW\text{-}b11}(\text{St}_{CPU\text{-}c1}, f_{CPU}) + \ldots + \text{Speed}_{SW\text{-}b16}(\text{St}_{CPU\text{-}c6}, f_{CPU}) \quad (4)$$

This calculation is based on the following idea. When a functional block is represented in terms of a function, the processing can be described in the C language. The description in the C language can be compiled to an assembly language. Thus, the number of steps in an assembler can be used for calculation of the processing speed.

The processing speed of the functional block b11 (f1-ip4-A), for example, in expression (4) can be calculated by expression (5) below.

$$\text{Speed}_{SW\text{-}b11}(\text{St}_{CPU\text{-}c1}, f_{CPU}) = \text{St}_{CPU\text{-}c1}/f_{CPU} \quad (5)$$

Since the actual processing speed is higher as the number of steps is smaller, the value of expression (5) is desirably as small as possible.

Next, the area is calculated as represented by expression (6) below using the mapping results.

$$\text{Area}_{HW\text{-}tot} = \text{Area}_{HW\text{-}f1\text{-}ip4} + \text{Area}_{HW\text{-}f2\text{-}ip1} + \text{Area}_{HW\text{-}f3\text{-}ip2} \quad (6)$$

That is, since there is available information on the IPs (f1-ip4, f2-ip1, and f3-ip2) used after the selection of the IP function and before the hierarchical expansion of the IP function, the areas of the HW portions can be obtained from this information.

$\text{Area}_{SW\text{-}tot}$ can be obtained in the following manner. By compiling the functional block, the memory size can be determined from an assembler. Therefore, the sizes of all the SW memory portions are summed up, and the summed memory size is multiplied by the area per bit (unit area) of DRAM that is calculated using a database called area DRAM. That is, expression (7) below is calculated.

$$\text{Area}_{SW\text{-}tot} = (M\text{size}_{SW\text{-}b11} + \ldots + M\text{size}_{SW\text{-}b16}) \times \text{Area}_{DRAM} \quad (7)$$

Since the IP has been expanded into functional blocks, the area may possibly be calculated overlapping between the functional blocks when the memory sizes are calculated for the SW portions of the functional blocks. Therefore, this overlap is taken into consideration to prevent deterioration in the precision of calculation of the area.

Next, the power consumption in the HW portions is calculated as represented by expression (8) below using the mapping results.

$$\text{Power}_{HW\text{-}tot} = \text{Power}_{HW\text{-}b11} + \ldots + \text{Powder}_{HW\text{-}b16} \quad (8)$$

The power consumption of the functional block b11 (f1-ip4-A), for example, in expression (8) can be calculated by expression (9) below.

$$\text{Power}_{HW\text{-}b11}(f_{c3}, V_{c3}) = \alpha_{b11} \times f_{c3} \times (V_{c3})^2 \times P_{c3} \quad (9)$$

where $\alpha_{b11}$ is the power coefficient of the functional block b11, which is extracted from the IP performance library, $f_{c3}$ is the operating frequency of the model c3 (ASIC1), $V_{c3}$ is the voltage of the model c3 (ASIC1), and $P_{c3}$ is the precedence of the model c3 (ASIC1). By using the precedence in place of the number of toggles, the power consumption can be determined with a measure of accuracy even in static analysis in which the number of toggles is not available.

The power consumption in the SW portions is calculated by expression (10) below.

$$\text{Power}_{SW\text{-}tot} = \text{Power}_{SW\text{-}CPU\text{-}tot} + \text{Power}_{SW\text{-}MEM\text{-}tot} \quad (10)$$

The first term of expression (10) is represented as follows.

$$\text{Power}_{SW\text{-}CPU\text{-}tot} = \alpha_{CPU} \times f_{CPU} \times \text{Load}_{CPU} \quad (11)$$

Where $\alpha_{CPU}$ is the power coefficient of CPU, which is extracted from the IP performance library, $\text{Load}_{CPU}$ is the load (0 to 1) of the CPU that is obtained by dividing "the sum (bits) of the memory sizes of the functional blocks mapped to SW" by "the sum (bits) of the memory sizes obtained if all the functional blocks are mapped to SW".

The second term of expression (10) is represented as follows.

$$\text{Power}_{SW\text{-}MEM\text{-}tot} = \alpha_{DRAM} \times f_{DRAM} \times (V_{DRAM})^2 \times P_{DRAM} \quad (12)$$

Where $\alpha_{DRAM}$ is the power coefficient of DRAM, which is extracted from the IP performance library, $f_{DRAM}$ is the operating frequency (Hz) of the DRAM, $V_{DRAM}$ is the voltage of the DRAM, and $P_{DRAM}$ is the precedence of the DRAM. By using the precedence, the power consumption can be determined with a measure of accuracy even in static analysis in which the number of toggles is not available.

By calculating the above expressions, the cost function (Cost-tot) is finally determined from expression (1). If the cost function is minimum or below a lower limit, the designed system is determined proper as far as the static analysis is concerned.

Performance Analysis (Dynamic Analysis)

In dynamic analysis, the area (Area) is the same as that in the static analysis, and therefore only the processing speed (Speed) and the power consumption (Power) are calculated. In dynamic analysis, simulation is performed by actually inputting data into the design system. From the simulation, therefore, the execution time (Time(sec)), input/output data of each functional block, and the toggle rate are obtained.

In dynamic analysis, basically, the elements obtained from the simulation are substituted into expressions (1) to (12), to obtain the value of the cost function (Cost-tot). In this calculation, the Time obtained from the simulation can be substituted for $(\text{Speed}_{HW\text{-}tot} + \text{Speed}_{SW\text{-}tot})$ in expression (1). The number of toggles of each model obtained from the simulation can be substituted for the precedence P of the model in expression (9). An average load obtained from the actual simulation is used for the load$_{CPU}$ in expression (11). The number of toggles of DRAM obtained from the simulation can be substituted for the precedence P of the DRAM in expression (12).

HW/SW Division (Static Division)

Next, HW/SW division of IPs performed during steps ST4 and ST5 will be described. HW/SW division can be made statically or dynamically. First, static division will be described.

FIG. 7 is an illustration for explaining static HW/SW division. As shown in FIG. 7, a hard IP used for a system such as a semiconductor device includes functions A, B, C, and D, and a setting register for setting ON/OFF of these functions. Note that the "function" used in the HW/SW division refers to the "functional block" in this embodiment described above. The IP performance library stores SW models of the functions A, B, C, and D described in a C/C++ language, for example. After the functions are operated in HW and SW, there may arise the necessity of changing, correcting, or deleting one function. In such a case, the function D, for example, in the setting register can be turned OFF to thereby stop supply of a clock to the function D and thus inactivate the function D. In this way, wasteful use of power can be suppressed to reduce the power consumption. Alternatively, the connection among the functions A to D may be changed.

Moreover, the function D, for example, may be switched from HW to a SW model prepared in the IP performance library, or the SW model prepared in the library may be corrected. In other words, by storing SW models equivalent to the respective functions in a library, one IP can be divided into HW and SW. By this HW/SW division, it is possible to continue the design even when the function of a hard IP is insufficient. In addition, it is possible to flexibly respond to a change of the system by performing correction or addition for the function of SW.

Dynamic HW/SW Division

In the HW/SW division shown in FIG. 7, no correction is performed in principle after the setting of HW and SW. However, in dynamic HW/SW division, that is, in switching between HW/SW operations, the function (functional block) can be flexibly subjected to change, addition, and correction during the operation. Examples of such dynamic HW/SW division will be described as follows as the first to third examples.

1. FIRST EXAMPLE

In the first example, the ON/OFF of each function of the IP shown in FIG. 7 is controlled by SW, and when the function is turned OFF, an equivalent SW model is retrieved from the IP performance library and used. The HW/SW switching can be performed while operating the function by use of a control signal to the setting resister.

2. SECOND EXAMPLE

Figure 8A:
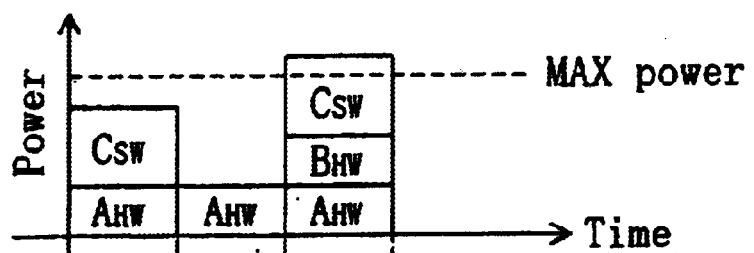
FIGS. 8A and 8B are timing charts of power consumption during dynamic HW/SW switching.
Figure 8B:
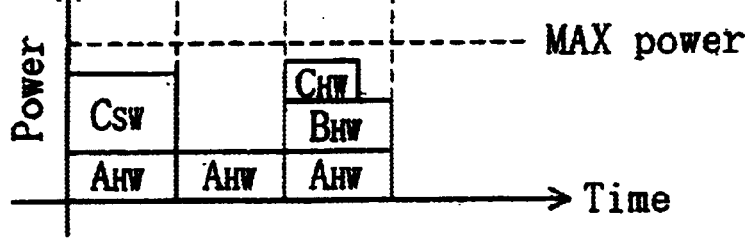

FIGS. 8A and 8B are timing charts of the power consumption (Power) during dynamic HW/SW switching. FIG. 9 is an example of a program for the HW/SW switching control described in the C language. Consider the case of controlling the function C of the hard IP under control of the setting register as shown in FIG. 9. Assume that the power consumption (Power) of the IP sometimes exceeds its upper limit MAX Power as shown in FIG. 8A. Which functions are operating at a certain time on the time axis is known from dynamic analysis. Therefore, the power consumed by the operating functions may be summed up and written in a register to detect the time at which the summed value exceeds the upper limit MAX Power. When the power consumption (Power) of the IP exceeds the upper limit MAX Power, the hard IP is operated under control of the setting register as shown in FIG. 9, and instead, func-C is retrieved from SW models and operated. In this way, as shown in FIG. 8B, the power consumption (Power) is prevented from exceeding the upper limit MAX Power, and thus operation under desired limited conditions is secured. In this example, therefore, design is made so that the function C is implemented by SW when the functions A and C of the IP are operated, but it may be implemented by HW when the functions A, B, and C are operated.

3. THIRD EXAMPLE

FIGS. 10A and 10B are views showing dependency of the processing speed (Speed) on the power consumption during dynamic HW/SW switching. FIG. 11 is an example of a program for the HW/SW switching control described in the C language. As shown in FIG. 11, under control of the setting register of CPU, the function C is controlled to be implemented by SW when the load (%) of the CPU is less than a certain value IDLE and implemented by HW when the load is equal to or greater than the value IDLE. If the function C is invariably implemented by SW, the processing time (Time) may exceed its upper limit MAX Time as shown in FIG. 10A. Therefore, the load (%) of the CPU is observed and written in a register while processing. The function C is implemented by HW as long as the load (%) of the CPU is equal to or greater than the value IDLE. When the CPU load (%) falls short of the lower limit IDLE, the function C of the hard IP is turned OFF under control of the setting register and instead, func-C is retrieved from SW models and operated. By the control described above, as shown in FIG. 10B, the processing time (Time) is prevented from exceeding the upper limit MAX Time, and thus operation under desired limited conditions is secured.

HW/SW Co-verification

Figure 12:
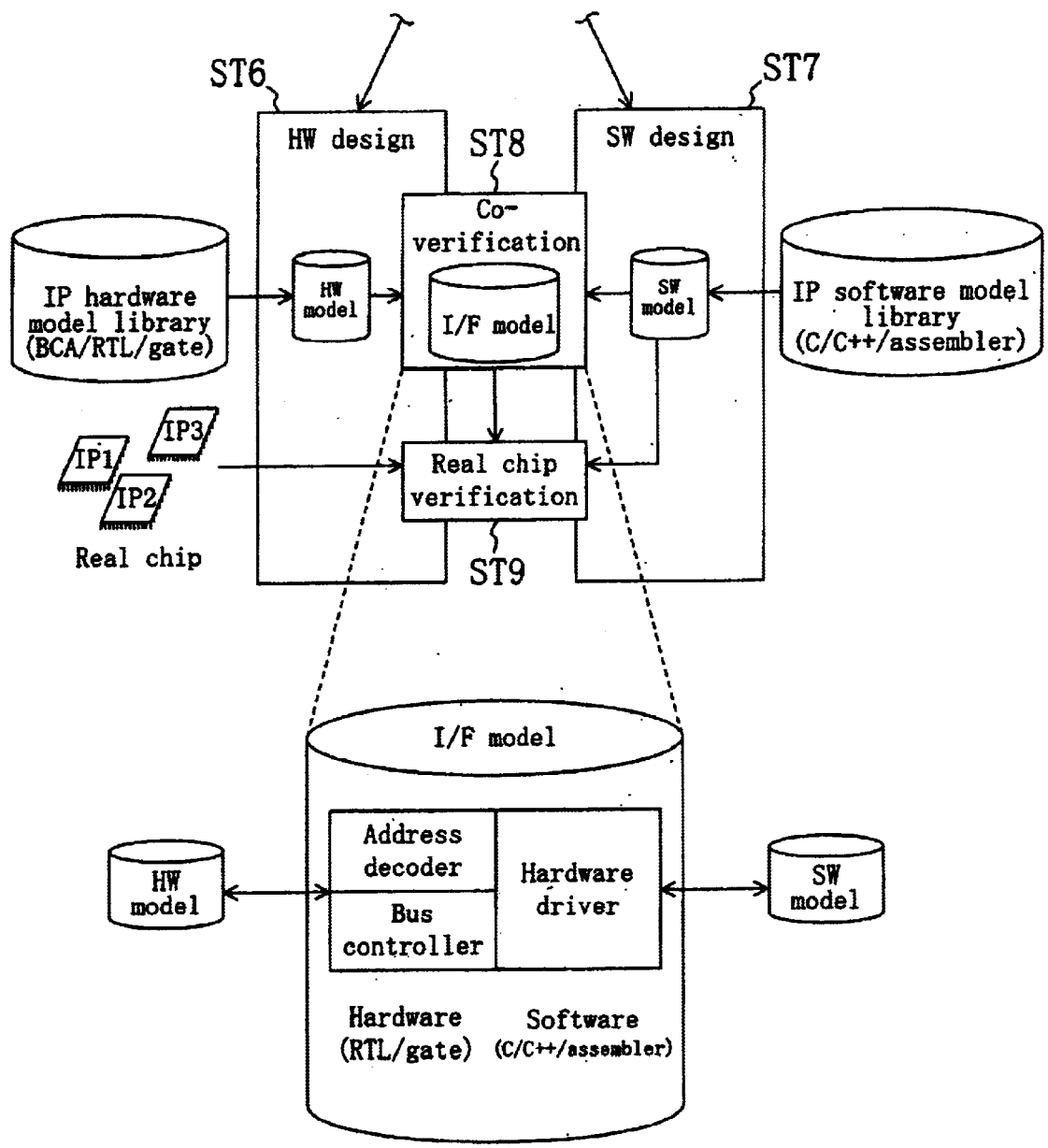
FIG. 12 is a partial flow diagram illustrating details of the processing in HW and SW design and HW/SW coverification.

Next, the co-verification in step ST8 will be described with reference to FIG. 12. HW design and SW design are performed in steps ST6 and ST7 in accordance with the constructions of HW and SW finally determined based on the mapping in step ST4 and the performance analysis in step ST5, to prepare HW models and SW models. An IP hardware model library (described at the BCA, RTL, or gate level) is used for preparation of HW models, while an IP software model library (described in the C language, C++ language, or assembler language) is used for preparation of SW models.

In step ST8, HW/SW co-verification is performed using the HW models and the SW models prepared in the steps St6 and ST7. For this co-verification, a HW-SW I/F model is necessary, which is prepared in the following procedure.

First, a memory map as shown in FIG. 13 is prepared. This memory map is obtained from SW object code and HW registers.

Addresses of the respective functional blocks are determined, and an address table of the functional blocks in the form of a database is entered in a memory map DB. As shown in FIG. 14, an address decoder is prepared by retrieving an association table between HW registers and the addresses in the memory map DB.

A bus controller prepares a HDL template for each arbitration method for each bus in accordance with the precedence (P) of each HW functional block. In other words, the bus controller extracts the address of the register for each HW from the memory map DB, prepares a function, and stores the function in a SW model as the driver function template.

FIG. 15 is an example of the driver function template for basic hardware accessing. By use of the memory map DB, the address decoder, and the function template described above, it is possible to activate SW from HW of the designed system and, in reverse, HW from SW of the system. In this way, HW/SW co-verification can be performed.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. A design method for a semiconductor integrated circuit device comprising the steps of:

(a) storing a plurality of IPs each having a function in a memory;

(b) constructing a function group structure for satisfying a certain specification;

(c) selecting and retrieving an IP from a plurality of IPs having the same function stored in the memory for each function in the function group structure and substituting the IP for the function in the function group structure;

(d) expanding the IP hierarchically into detailed functional blocks; and (e) mapping each of the detailed functional blocks obtained by the hierarchical expansion to a HW model and a SW model of architecture models in a database.

2. The design method of claim 1, wherein in the step (e), static analysis considering overlap of an area is performed for HW portions of the detailed functional blocks.

3. The design method of claim 1, further comprising the step of:

(f) performing dynamic performance analysis of processing speed and power consumption for determining the mapping of each detailed functional block in the function group structure to a HW model and a SW model after the step (e).

4. The design method of claim 3, wherein the database stores a SW model having a function equivalent to a HW model for each function of the HW model.

5. The design method of claim 4, wherein in the step (f), the mapping of each detailed functional block to a HW model and a SW model is switched so that the power consumption is kept from exceeding an upper limit.

6. The design method of claim 3, wherein in the step (f), when the load rate of CPU obtained when a detailed functional block is mapped to a HW model is below a certain lower limit, the mapping of the detailed functional block is switched to a SW model.

7. The design method of claim 1, wherein in the step (e), analysis considering power consumption of a memory is performed.

* * * * *